US007232692B2

(12) United States Patent
Guenter et al.

(10) Patent No.: US 7,232,692 B2
(45) Date of Patent: Jun. 19, 2007

(54) PHOTO-IMAGED STRESS MANAGEMENT LAYER FOR SEMICONDUCTOR DEVICES

(75) Inventors: James Guenter, Garland, TX (US); Robert Hawthorne, Garland, TX (US); Jose Aizpuru, Murphy, TX (US)

(73) Assignee: Finisar Corporation, Sunnyvale, CA (US)

(*) Notice: Subject to any disclaimer, the term of this patent is extended or adjusted under 35 U.S.C. 154(b) by 112 days.

(21) Appl. No.: 11/071,940

(22) Filed: Mar. 4, 2005

(65) Prior Publication Data

US 2006/0199282 A1 Sep. 7, 2006

(51) Int. Cl.
*H01L 21/00* (2006.01)
(52) U.S. Cl. .......................................... 438/3; 257/295
(58) Field of Classification Search ................ 438/3, 438/124, 127, 129; 257/295, 790
See application file for complete search history.

(56) References Cited

U.S. PATENT DOCUMENTS 6,849,391 B2\* 2/2005 Yamaguchi et al. ........ 430/326
6,884,662 B1\* 4/2005 Chen et al. ................. 438/124

\* cited by examiner

*Primary Examiner*—Phuc T. Dang
(74) *Attorney, Agent, or Firm*—North Weber & Baugh LLP

(57) ABSTRACT

A photo-imaged stress management layer for a semiconductor device is described. The stress management layer is located on an outer surface of a semiconductor device and may be patterned to address certain stress compensation requirements of the semiconductor device. The stress management layer may be manufactured onto the semiconductor device using a photolithographic procedure that allows both simple and complex patterns to be realized.

16 Claims, 5 Drawing Sheets

110

Semiconductor Device
100

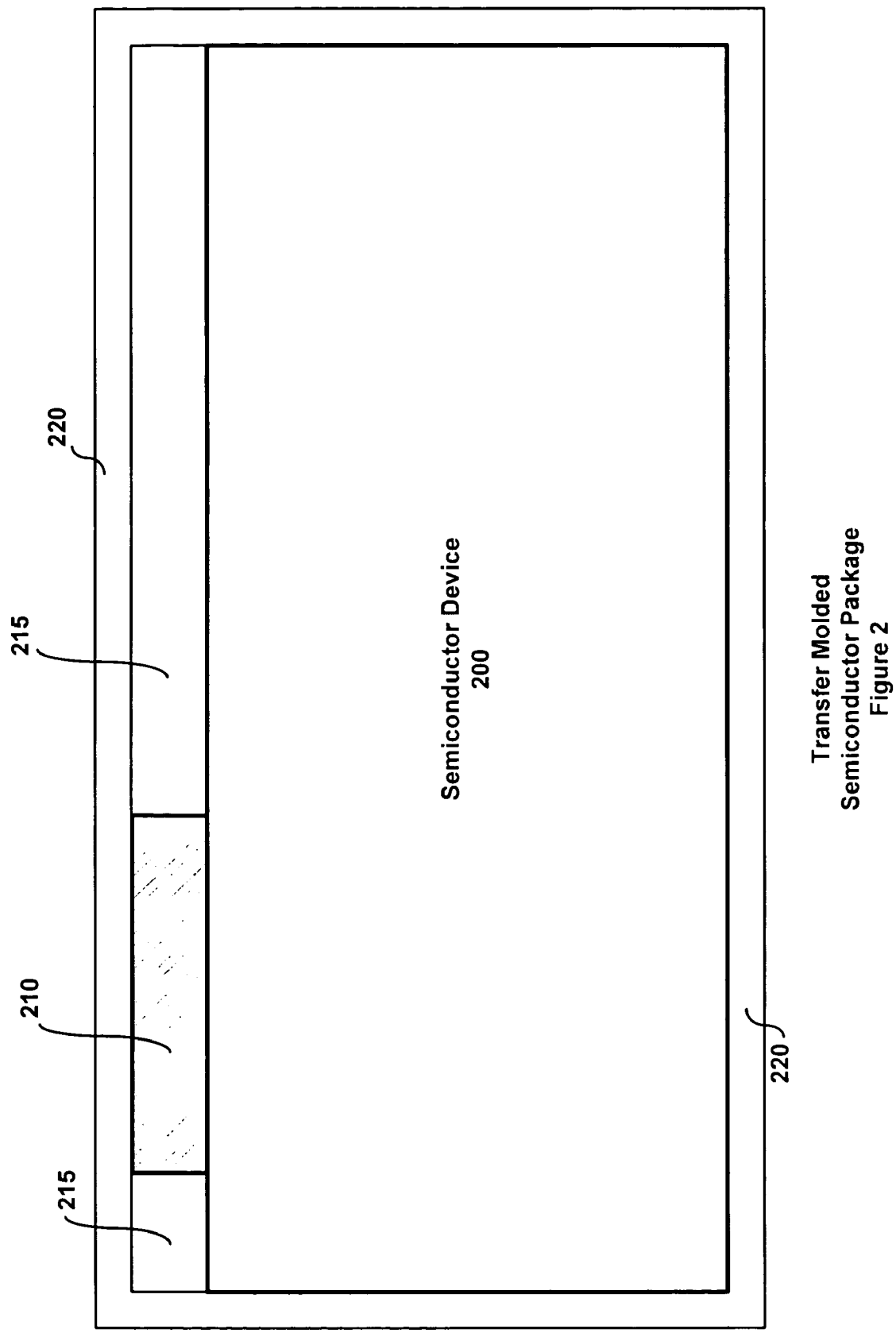

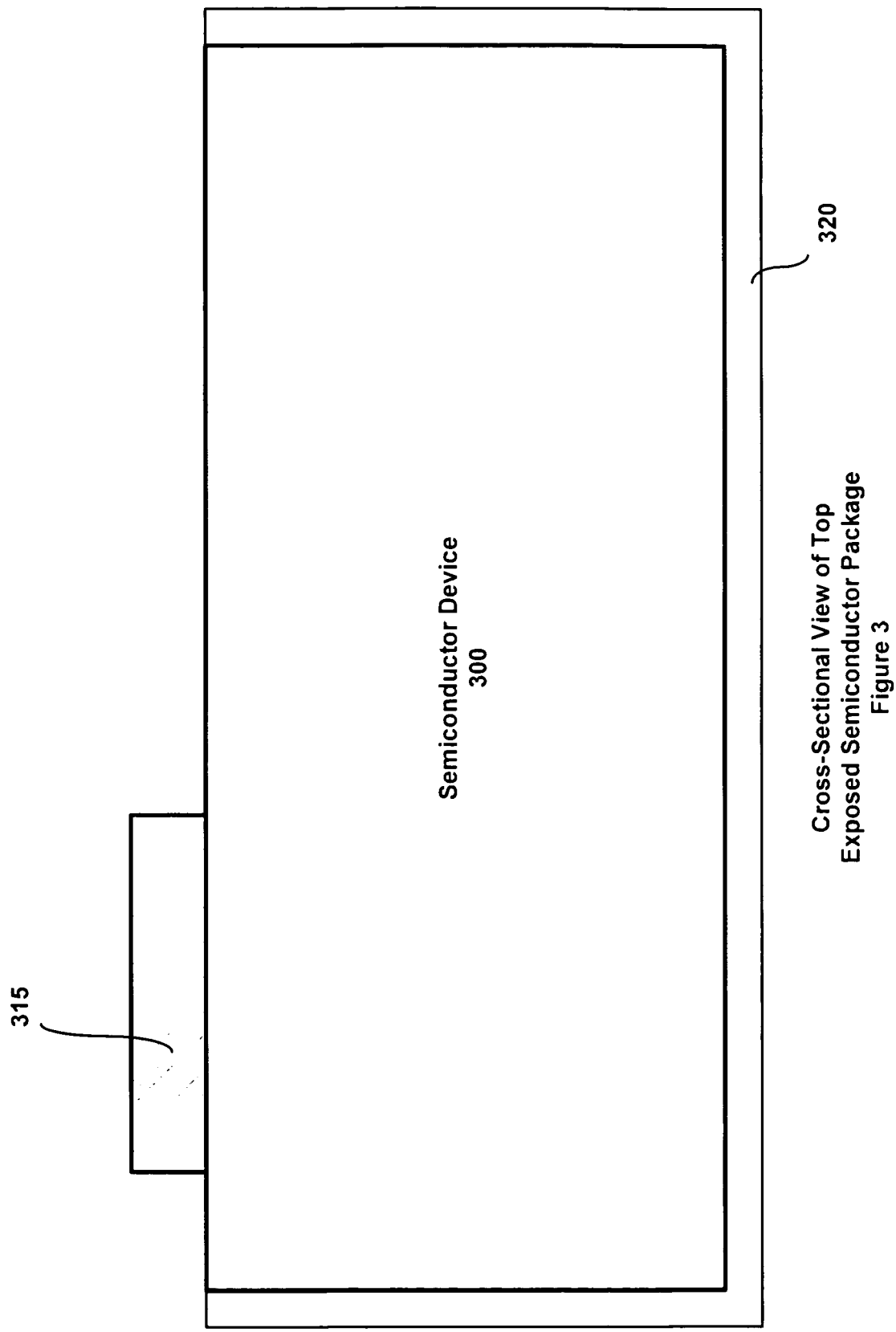

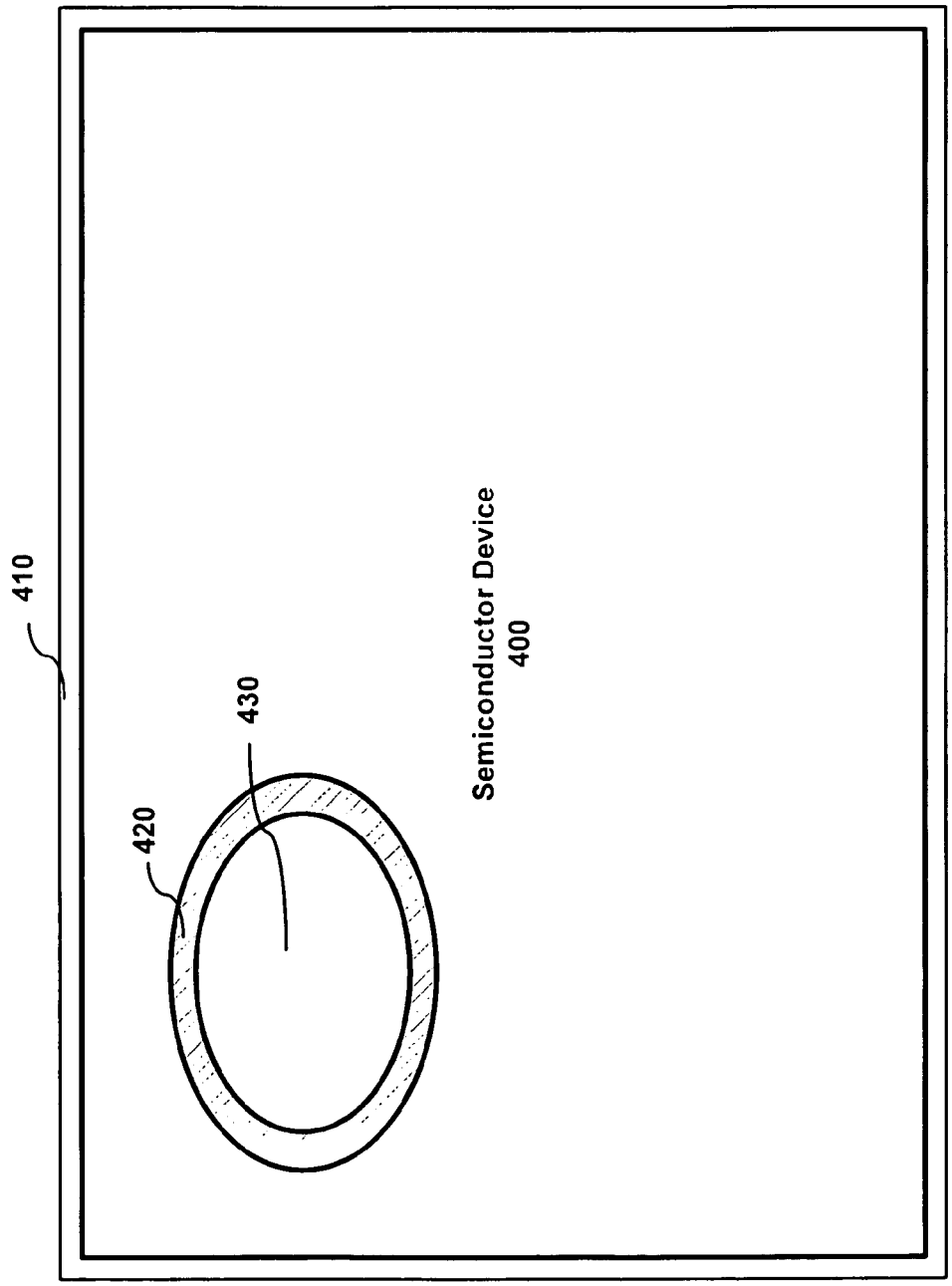

PHOTO-IMAGED STRESS MANAGEMENT LAYER FOR SEMICONDUCTOR DEVICES

BACKGROUND

A. Technical Field

The present invention relates generally to the management of stress on a semiconductor device, and more particularly, to the manufacturing and design of a stress management layer on a semiconductor device.

B. Background of the Invention

Semiconductor devices are sensitive to mechanical stress, which may misshape or otherwise harm a semiconductor device. This mechanical stress may adversely affect the performance of the device, and over time, reduce the length of its operative life. One source of mechanical stress is a package, in which a semiconductor device is located, that functions to protect the semiconductor device from its environment and provides an interface for electrical and potentially optical signals.

A semiconductor device may be packaged in various types of semiconductor packages. Examples of available semiconductor packages include transfer molded and pour molded packages. Typically, these packages are made of a molding compound that surrounds the semiconductor device and functions as a barrier between the device and the outside environment. Although the purpose of this molding compound is to protect the semiconductor device, it may actually harm the device as it reacts to temperature changes. This package molding compound may expand or contract at a different rate than the semiconductor device relative to temperature changes caused either by the semiconductor device itself or the outside environment. In particular, the molding compound and semiconductor device may have different thermal expansion coefficients which cause different rates of expansion or contraction relative to a temperature change. This expansion or contraction of the surrounding molding compound applies mechanical stress on the semiconductor device and may reduce the performance, shorten the life, or otherwise damage the device. Thus, as the semiconductor device goes through a series of temperature cycles, the damage caused by this mechanical stress may be compounded resulting in significant shortening of the operative life of the semiconductor device.

One semiconductor device that is particularly sensitive to outside mechanical stress is a surface emitting laser. Surface emitting laser devices also have specific requirements for packaging that may limit the options available to compensate for this mechanical stress. In particular, the molding compound and any filler material between the compound and the device need to be relatively clear to allow light to be emitted from the device. Plastic packaging, having certain transparent properties, is typically used to package surface emitting laser semiconductor devices. As described above, this plastic packaging may expand and contract at a different rate relative to temperature than does the surface emitting laser semiconductor device. Accordingly, as the package molding and filler material expands or contracts, mechanical stress may be placed on the surface emitting laser semiconductor device or components therein.

Certain components or areas of a semiconductor device are particularly sensitive to mechanical stress. For example, an active region within a surface emitting laser is more easily damaged from stress than other components of the laser. This active region contains components, such as mirrors that create a lasing cavity. External stress may induce mechanical stress into these components and thereby diminish the operation of the lasing cavity and the surface emitting laser. Other semiconductor devices, such as other types of lasers or sensors of several varieties, may also contain specific components that are highly-stress sensitive. As a result, a semiconductor device may have certain areas or components that need more protection against stress than other components in the device.

Current methods to reduce stress on a semiconductor device are often difficult, expensive and time consuming to apply. One such method is the use of a syringe to drop liquid material, on a semiconductor device after fabrication. This method, however, does not allow stress management material to be patterned on a substrate nor provide any control of the thickness of this material on the semiconductor itself. Additionally, these current methods are unable to specifically address certain portions of a semiconductor that may be more sensitive to stress, while leaving uncovered other areas for facilitation of electrical contact, for example.

SUMMARY OF THE INVENTION

The present invention provides a stress management layer, on a semiconductor device, which may be patterned, and its thickness adjusted, relative to the semiconductor device or component therein. This stress management layer functions to compensate for mechanical stress that may be introduced to the semiconductor device from sources external to the device itself. For example, a semiconductor package, in which the semiconductor device is located, may stress the device as both device and package expand or contract at different rates relative to temperature change. The stress management layer is positioned between the semiconductor device, and/or component therein, and a stress source so that it may absorb at least a portion of the stress that would otherwise be applied to the semicoductor device.

According to one embodiment of the invention, the stress management layer is manufactured using a photo sensitive compound(s) that allows the layer to be patterned using a photolithographic process. This photo sensitive compound is spun onto a surface of the semiconductor device in a particular thickness. Thereafter, a photolithographic procedure is used to pattern the compound on a surface of the semiconductor device. Because of this ability to pattern the stress management layer, the layer may be designed to protect certain features or components of a semiconductor device. For example, the stress management layer may be positioned over an active region, which is particularly sensitive to stress, in a surface emitting laser to specifically protect the area of the semiconductor containing this active region.

According to another embodiment of the invention, the stress management layer is patterned to provide additional functions or features to the semiconductor device. For example, there may be instances where focusing stress on a certain area of a semiconductor device provides a desired result, such as controlling the polarization of an emitted light source. Additionally, the stress management layer may contain a reservoir in which material having a certain characteristics may be kept. This material may provide features such as attenuation or lensing as light is emitted through the material from the semiconductor device.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 2 is a cross sectional view of a transfer molded packaged semiconductor device with a shaped stress management layer according to one embodiment of the present invention.

FIG. 3 is a cross sectional view of an exposed packaged semiconductor device with a shaped stress management layer according to one embodiment of the present invention.

FIG. 4 is a top view of a shaped reservoir photo sensitive layer on an exposed packaged semiconductor device according to one embodiment of the present invention.

DESCRIPTION OF THE PREFERRED EMBODIMENTS

A photo-imaged semiconductor stress management layer, and method of manufacturing thereof, is described. In one embodiment of the present invention, a photo sensitive compound is spun onto a semiconductor device and used to create a stress management layer that protects a semiconductor device from mechanical stress. In yet another embodiment, this stress management layer may be patterned and/or designed, using for example a photolithographic procedure, to provide certain stress management characteristics or other functionality to the semiconductor device on which it resides.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different semiconductor devices that are sensitive to mechanical stress including, but not limited to, processors, lasers, detectors, and sensors. The embodiments of the present invention may also include a number of different types of chemical compounds that may be used to create the stress management layer. Structures and devices shown below in block diagram are illustrative of exemplary embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 1A:
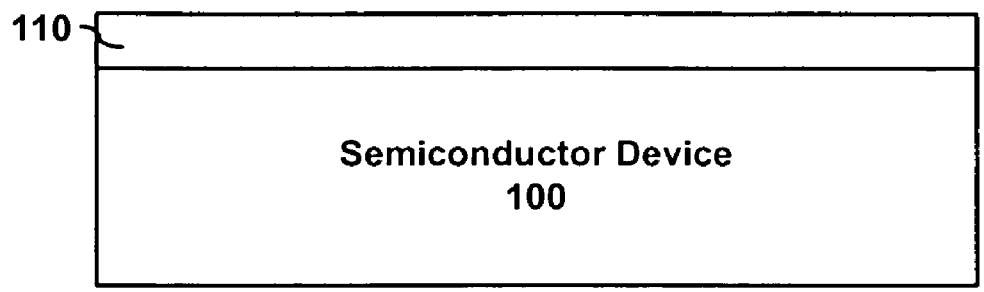
FIGS. 1A-1C are diagrams that illustrate the manufacturing of a shaped photo-imaged stress management layer on a semiconductor device according to one embodiment of the present invention.
Figure 1B:
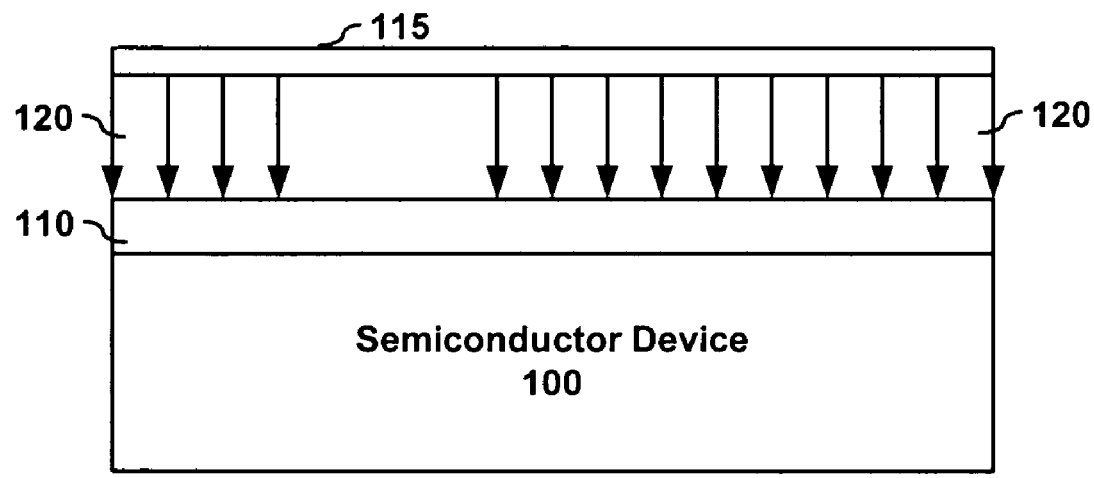
Figure 1C:
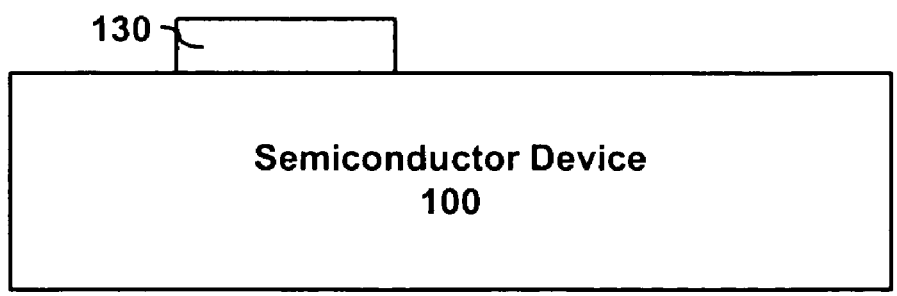

The present invention provides a stress management layer on a semiconductor device that may be patterned relative to a semiconductor device and/or to protect certain areas of the device containing stress sensitive components from mechanical stress. This stress management layer may be patterned to the specific stress requirements of a semiconductor device and may be created during the manufacturing process of the semiconductor device. FIGS. 1A-1C illustrate manufacturing stages of the stress management layer according to one embodiment of the invention.

FIG. 1A shows a semiconductor device 100 having a photo sensitive layer 110 spun on its top outer surface. Although illustrated on the top layer, this photo sensitive layer may be placed on any of the outer surfaces of the semiconductor device. Photo sensitive compounds may be spun, using techniques known within the semiconductor manufacturing field, onto the outer surface of the semiconductor device to create this photo sensitive layer 110. Examples of such compounds that may be used to form this photo sensitive layer include Poly-Methacrylate, Benzo-Cyclo-Butene, SU-8, and Polyimide.

The photo sensitive layer 110 has characteristics that allow it to be manufactured on the device and thereafter protect against (or in some cases, to enhance) stress placed on the semiconductor device. The photo sensitive layer 110 may be applied in various thicknesses to allow the layer 110 to more effectively absorb or compensate for stress applied to a particular device. Typically, a thicker layer would be able to more effectively compensate for larger stress than a thinner layer. These layers may be applied in 10-100 microns thickness depending on its particular application; however, there may be instances where a thinner or thicker layer is appropriate. Also, the photo sensitive layer 110 may have certain characteristics relative to the type of semiconductor device on which it is spun. If, for example, the semiconductor device is a surface emitting laser, then the photo sensitive layer should have a refractive index that allows light that is emitted from the surface of the device 100 to pass through the layer 110. One skilled in the art will recognize that this photo sensitive layer may be used on numerous different types of semiconductor devices and may be applied using different manufacturing methods, and may thus be tailored to have certain characteristics relative to a particular semiconductor device on which the layer will reside.

FIG. 1B shows a semiconductor device 100, having a photo sensitive layer 110 that is being exposed to light 120 through a mask 115 in order to shape a stress management layer that results from a photolithographic procedure. The portions of the photo sensitive layer 110 that are exposed to the light 120 will react to the light 120. If for example, the photo sensitive material is a positive photoresist, then the material exposed to the light will soften. Comparatively, a negative photoresist will harden when it is exposed to light. After exposure, either the imaged or non-imaged photo sensitive material is removed resulting in a pattern relating to the mask 115.

FIG. 1C shows a stress management layer pattern 130, oil the semiconductor device 100, after development of the photo sensitive layer. In this illustration, a small block of photo sensitive material 130 remains over a portion of the semiconductor device 100 to protect certain portions of the semiconductor device 100 from stress. As mentioned above, this remaining block 130 may have various thicknesses, reflective properties or other characteristics related to its particular application and or semiconductor device 100 on which it resides. One such characteristic, a high thermal expansion coefficient, allows the remaining block 130 to absorb mechanical stress from external forces. Furthermore, this block 130 may be aligned with a component or area in the semiconductor device 100, such as a laser's active region, that is sensitive to stress.

It is important to note that a relatively simple block design is used in FIG. 1C for illustration purposes. According to the invention, the stress management layer on the semiconductor device 100 may be patterned to have complex designs or patterns which may protect certain areas on the semiconductor device 100, transfer stress across the semiconductor device 100 in a particular manner, or even focus stress on a particular component in the semiconductor device 100 itself.

Reference features on the semiconductor device may provide good indications on where a stress management layer should be positioned. For example, a reference feature relating to the location of an active region in a surface emitting laser may be used to position the photo sensitive layer so that stress on this active region may be reduced. This alignment between the location of sensitive components and the location photo sensitive material allows an engineer to tailor stress management to particular semiconductor devices.

B. Transfer Molded Packaged Semiconductor Devices

FIG. 2 illustrates a transfer molded package containing a semiconductor device 200 having a patterned stress management layer 210. Molding compound 220 that surrounds the semiconductor device 200 is used to protect the device 200 and facilitate assembly of the device into a system or onto a board. There may be a gap or gaps 215 between the molding compound 220 and the semiconductor device 200 that may be filled with filler material or air, or there may be no gap at all and the molding compound contact the semiconductor device in all areas not covered by the patterned stress management layer.

Oftentimes, this molding compound 220 has a thermal expansion coefficient that is higher than the thermal expansion coefficient of the semiconductor device 200. As the temperature of the semiconductor 200 and package molding compound 220 changes, the molding compound 220 may expand or contract at a different rate than the semiconductor device 200. Thus, as the temperature changes, the molding compound 220 may apply mechanical stress on the semiconductor device 200 as it expands and contracts relative to temperature changes.

The stress management layer 210 shown in FIG. 2 may be used to compensate for the differing thermal expansion coefficients. For example, if the thermal expansion coefficient of the patterned stress management layer 210 is larger than the coefficients of the molding compound and semiconductor device, then this layer may effectively absorb stress on the semiconductor device 200 or component within the semiconductor device 200. One example is when the thickness-expansion coefficient product of the semiconductor when added to the thickness-expansion coefficient product of the stress management layer produces a sum that matches the product for an equal total thickness of the molding compound. The thickness and pattern of the stress management layer may be tailored to the characteristics of the semiconductor package (e.g., thermal expansion coefficient of the molding compound) and the semiconductor device (e.g. location of stress sensitive components, thermal expansion coefficient of the semiconductor material). An engineer may model the stress that may be applied to a semiconductor device, and from this model, create a stress management layer thickness and pattern that addresses this modeled stress.

According to one embodiment of the invention, a patterned stress management layer may be created in a transfer molded surface emitting laser package. As mentioned above, a surface emitting laser has an active region that is highly sensitive to mechanical stress. This active region may be protected against stress by patterning the stress management layer relative to this active region itself. According to one embodiment of the invention, a stress management layer block, like the block 210 illustrated in FIG. 2, may be positioned over the active region on surface emitting laser. Reference markers on the surface emitting laser may be used to ensure that the stress management layer block is positioned correctly relative to the active region. This stress management layer block may also have reflectivity properties that allow light to pass through the block itself, which would allow the surface emitting laser to operate appropriately.

According to one embodiment of the invention, the stress management layer may also be used to channel or focus stress on a particular area. For example, the polarization of a light emission may be controlled by providing uni-axial mechanical stress on a light source. Thus, by focusing stress onto a particular light source, the polarization of a laser output may be controlled by the introduction of stress onto its source. One skilled in the art will recognize that the focusing of stress on certain elements may be advantageous.

According to yet another embodiment of the invention, the stress management layer may also be used in a flip-chip bonding application. A stress management layer may be applied and patterned between the underfill or board and the bottom outer surface of a semiconductor device. This stress management layer may compensate for stress from a board or underfill that is next to the semiconductor device.

C. Open Packaged Semiconductor Device

FIG. 3 shows a cross section view of a semiconductor device that is packaged having at least one surface that is open outside the package itself. A typical application of this open-ended packaging is a sensor package that requires the sensor to interface with a device or signal that is external to the package.

As illustrated in FIG. 3, a semiconductor device 300 is surrounded by molding compound 320 on all of its sides except the top surface. A patterned stress management layer 315 is positioned on the open top surface to absorb stress that may be applied to the top surface or portion thereof.

This stress management layer 315 may be positioned on the top surface relative to a particular component in the semiconductor device 300 or relative to an external object that may apply stress to the semiconductor device 300. For example, silicon pressure sensors or Hall-Effect sensors may employ a piezoelectric element that responds to pressure to generate an electrical signal. Unintended mechanical stress on a sensor may cause its piezoelectric element to erroneously generate an electrical signal. A properly designed stress management layer may reduce the mechanical stress applied on a sensor or its sensing element; thereby, improving the accuracy of the sensor itself.

FIG. 4 shows a top view of semiconductor device 400 having a stress management layer that is patterned to contain a reservoir of material with desired characteristics according to one embodiment of the invention. As illustrated, the semiconductor device 400 is surrounded by molding compound 410 on all of its surfaces except the top surface. A patterned stress management layer 420 is located on the top surface and contains an empty reservoir 430 in which material may be located.

This material, which is located within the reservoir 430, may improve the properties of the semiconductor device 400 or provide additional functions to the semiconductor device 400. The ability to control the manufacturing and pattern of the stress management layer 420 may be leveraged to create encapsulations that may hold other material which is not easily controlled during manufacturing. For example, silicon RTV may be inserted into the reservoir 430, which was patterned in the stress management layer 420, to improve or add characteristics to the semiconductor device.

According to one embodiment of the invention, material within the reservoir 430, may interact with light emitted from the semiconductor and produce a light of a particular wavelength or color. According to another embodiment, the material within the reservoir 430 may be a chemical compound used to sense certain elements that are present external to the semiconductor device 400. According to yet another embodiment, the material within the reservoir 430 may be used to adjust properties of light emitted from the semiconductor device 400, such as performing a lensing operation on the light. One skilled in the art will recognize the numerous different applications for the reservoir 430 within the stress management layer 420, all of which are included in the present invention.

D. Method of Manufacturing a Stress Management Layer on a Semiconductor Device

Figure 5:
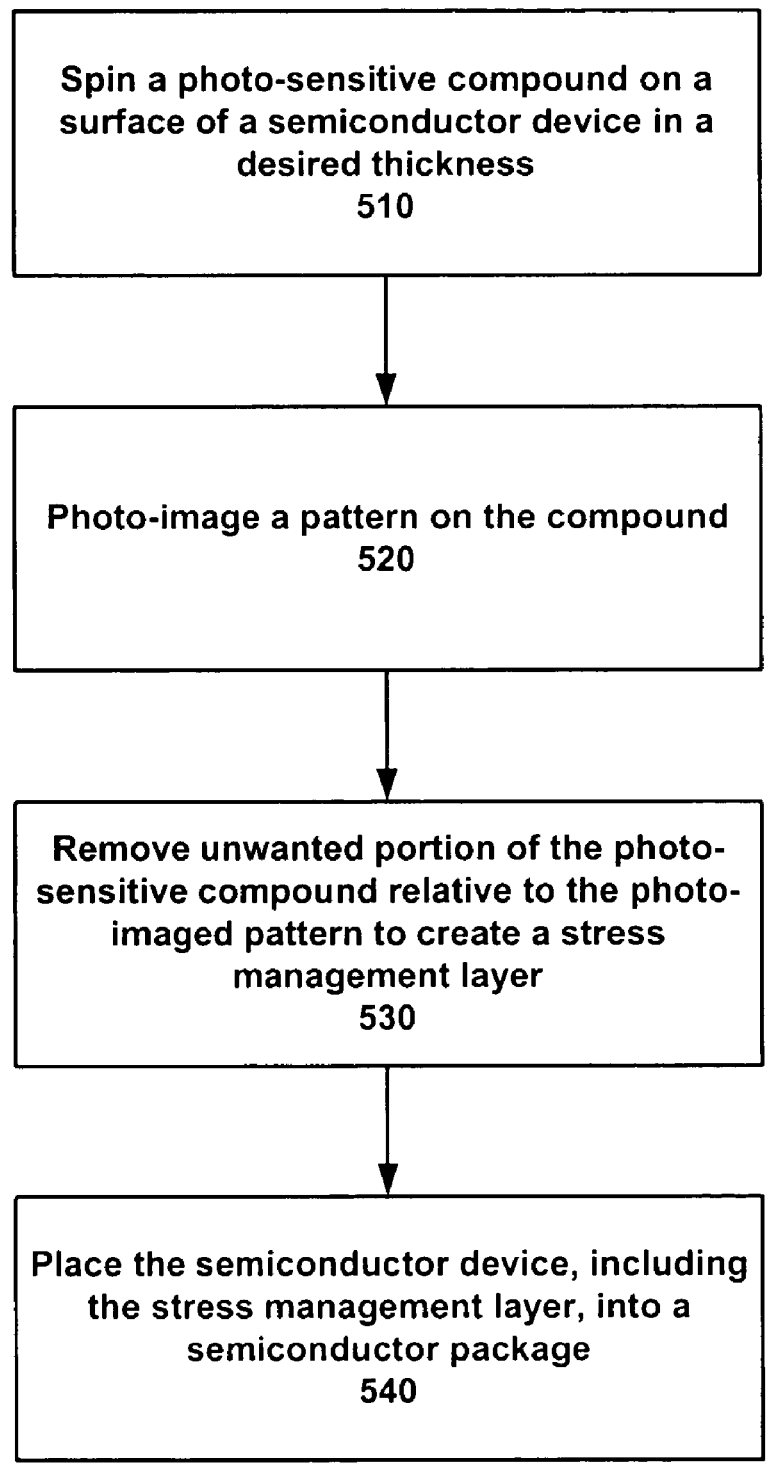
FIG. 5 is a flow chart illustrating a method of manufacturing a shaped photo-imaged stress management layer on a semiconductor device according to one embodiment of the present invention.

FIG. 5 illustrates a method for manufacturing a stress management layer on a semiconductor device according to one embodiment of the invention.

A photo sensitive compound is spun 510 onto a surface of a semiconductor device in a particular thickness. Typically, this thickness is between 10-100 microns, but may vary according to the type of semiconductor device and the anticipated magnitude of stress that the device experiences. This compound may also have certain properties, such as transparency characteristics, that allow it to more effectively function on a particular semiconductor device. Examples of this compound are provided above.

The photo sensitive compound is imaged 520 to create a pattern on the compound. One method in which the compound may be imaged is using photolithography where a mask and light source are used to create a pattern on the compound itself. Thereafter, excess compound is removed 530 from the semiconductor device resulting in a desired pattern and thickness of the stress management layer.

The semiconductor device, including the stress management layer, may then be positioned 540 within a package. The stress management layer is able to effectively absorb stress introduced onto the semiconductor device from the package.

While the present invention has been described with reference to certain exemplary embodiments, those skilled in the art will recognize that various modifications may be provided. For example, numerous types of compounds may be used as the stress management level and this level may be manufactured or positioned using numerous different methods. Variations upon and modifications to the exemplary embodiments will become apparent to those skilled in the art having read the above disclosure. Accordingly, the scope of the invention is to be limited only by the following claims.

We claim:

1. A method for manufacturing a stress management layer on a semiconductor device, the method comprising:
    placing a photo sensitive compound on at least a portion of a surface of the semiconductor device;
    patterning the photo sensitive compound on the surface of the semiconductor device using a photolithographic procedure;
    removing excess photo sensitive compound from the surface to create the stress management layer; and
    wherein the photo sensitive compound reduces stress on a package housing of the semiconductor device caused by expansion or contraction of the semiconductor device itself and is designed to transfer stress away from at least one particular component within the semiconductor device.

2. The method of claim 1 wherein the photolithographic procedure comprises exposing the photo sensitive compound to light through a pattern mask.

3. The method of claim 1 wherein the photo sensitive compound is placed on the at least a portion of the surface of the semiconductor device at a thickness between 10 to 100 microns.

4. The method of claim 1 wherein the photo sensitive compound is a material selected from a group consisting of Poly-Methacrylate, Benzo-Cyclo-Butene, SU-8 and Polyimide.

5. The method of claim 1 wherein the photo sensitive compound is patterned relative to the at least one component within the semiconductor device.

6. The method of claim 5 wherein the at least one component is an active region of a surface emitting laser.

7. The method of claim 1 wherein the stress management layer comprises a reservoir in which a material may be located.

8. The method of claim 7 wherein the material located within the reservoir is material that modifies light emitted from the semiconductor device.

9. The method of claim 7 wherein the material located within the reservoir is a material that senses the presence of a chemical exterior to the semiconductor device.

10. A semiconductor package comprising.
    a outer housing of molding compound that provides a exterior surface of the semiconductor package;
    a semiconductor device, positioned within the outer housing, having thermal properties that cause the device to expand or contract relative to temperature changes;
    a stress management layer, positioned between the outer housing and the semiconductor device, having elastic properties which allow the stress management layer to absorb stress caused by the expansion or contraction of the semiconductor device; and
    wherein the stress management layer is a photo sensitive compound that is manufactured on the semiconductor device using a photolithographic procedure and is designed to transfer stress away from at least one particular component within the semiconductor device.

11. The stress management layer of claim 10 wherein the photo sensitive compound is between 10-100 microns thick.

12. The stress management layer of claim 10 wherein the photo sensitive compound is selected from a group consisting of Poly-Methacrylate, Benzo-Cyclo-Butene, SU-8 and Polyimide.

13. The stress management layer of claim 10 wherein the semiconductor device is located within a transfer molded package.

14. The stress management layer of claim 10 wherein the semiconductor device is a surface emitting laser.

15. The stress management layer of claim 10 wherein the semiconductor device is located in an open molded package.

16. The stress management layer of claim 15 wherein the semiconductor device is a sensor.

* * * * *